United States Patent [19]

George et al.

[11] 4,308,591
[45] Dec. 29, 1981

[54] BUBBLE MEMORY HAVING NON-UNIFORMLY WOUND Y DRIVE FIELD COIL

[75] Inventors: Peter K. George, Morgan Hill, Calif.; Saleem Akhtar, Groton, Mass.

[73] Assignee: National Semiconductor Corporation, Santa Clara, Calif.

[21] Appl. No.: 192,064

[22] Filed: Sep. 29, 1980

[51] Int. Cl.³ ............................................. G11C 19/08
[52] U.S. Cl. ................................................. 365/2; 365/6; 365/15
[58] Field of Search ................................. 365/2, 6, 15

[56] References Cited

U.S. PATENT DOCUMENTS 4,045,786  8/1977  Lee et al. ................................. 365/6

Primary Examiner—James W. Moffitt
Attorney, Agent, or Firm—Brown & Martin

[57] ABSTRACT

In a field-access magnetic bubble memory X and Y coils encircle the chip for providing the rotating XY magnetic drive field when conventional drive signals are applied thereto. At least one of the coils is non-uniformly wound to provide a first predetermined magnitude of the drive field in first predetermined chip areas and a second lesser predetermined magnitude of the drive field in a second chip area. In the embodiment disclosed the chip has a dual-block replicate architecture with gates and bubble detectors requiring a relatively high drive field located in peripheral edge areas at the bottom and top of the chip. A plurality of data storage loops requiring a relatively low drive field are located in the medial portion of the chip. The outer layer of the Y coil is non-uniformly wound to provide a gap in registration with the medial area of the chip. As a result, the magnitude of the drive field is higher in the peripheral edge areas than in the medial storage area, making possible a reduction in coil power consumption.

11 Claims, 7 Drawing Figures

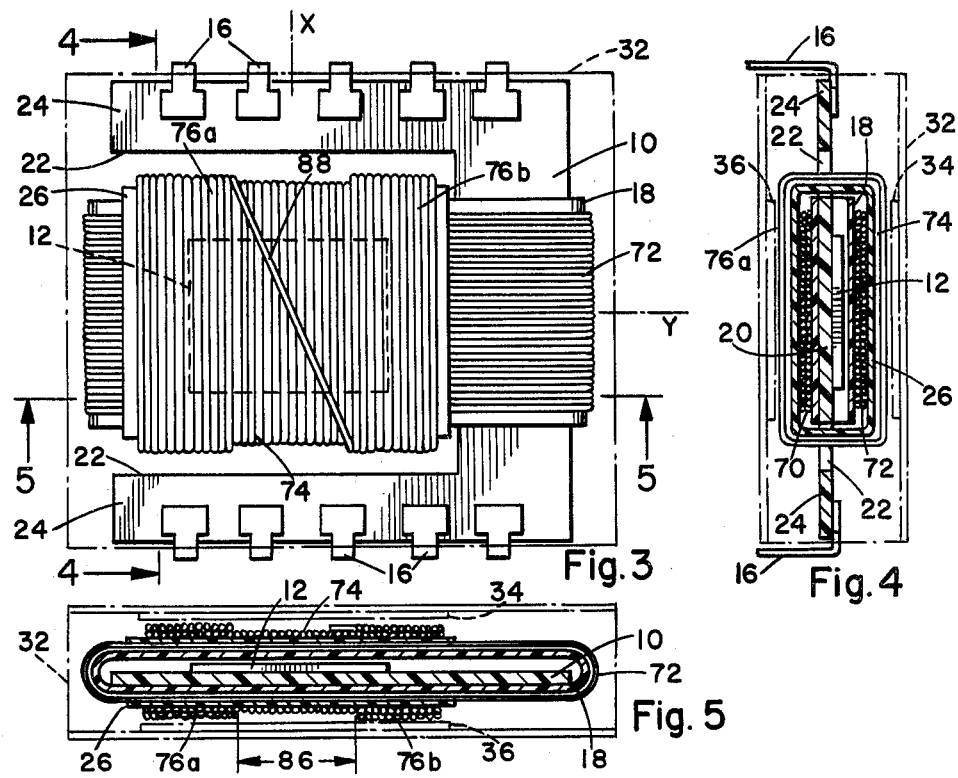
Fig. 3
Fig. 4
Fig. 5
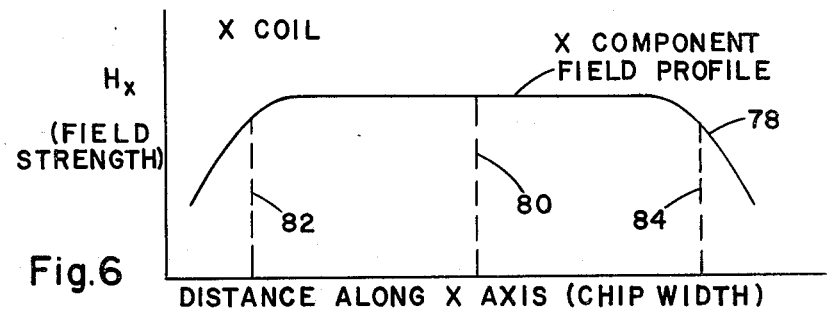
Fig. 6
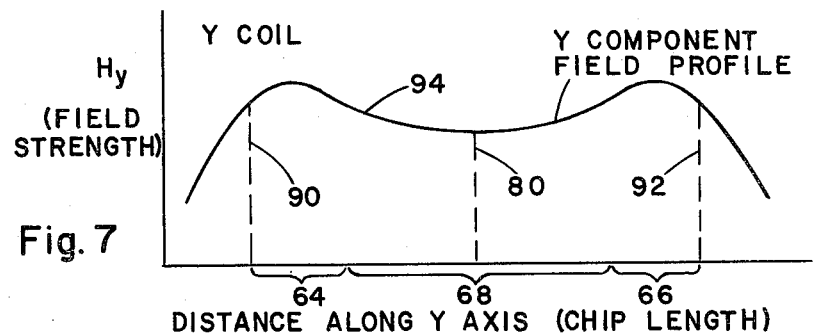
Fig. 7

BUBBLE MEMORY HAVING NON-UNIFORMLY WOUND Y DRIVE FIELD COIL

BACKGROUND OF THE INVENTION

The present invention relates to magnetic bubble memories, and more particularly, to a magnetic bubble memory with reduced coil power consumption due to non-uniform winding of its Y drive field coil.

Information storage and retrieval in the conventional magnetic bubble memory devices is accomplished and measured by the presence or absence of magnetic bubble domains which are propagated and manipulated on a chip. Typically, the chip includes a plurality of spaced apart permalloy propagation elements which overlie a thin film of garnet. The maintenance and propagation of the magnetic bubble domain along the paths of the propagation elements is accomplished through the utilization of an in-plane rotating magnetic drive field (XY drive field) in the presence of a bias magnetic field (Z bias field). As the drive field rotates, the bubbles jump between adjacent propagation elements crossing the gap which exists therebetween.

The bubble memory chip is typically sandwiched between upper and lower permanent magnets which supply the Z bias field. The XY in-plane drive field can be supplied by several geometries of coils. The most popular arrangement is shown and described in an article entitled "Bubble Memories Come to the Boil" by Peter K. George and George Reyling, Jr., published in the Aug. 2, 1979 edition of ELECTRONICS magazine starting at page 99. As shown therein, it is conventional to mount the bubble chip in the center leg of a E-shaped chip carrier to facilitate assembly of the orthogonal XY drive field coils. Drive field circuitry provides the electrical current to the XY coils which is required to generate the necessary rotating field. Though it has been demonstrated that the bubbles themselves are capable of 500-kilohertz operation, a practical upper limit is probably 200-kilohertz. This limit is set by the power dissipation in the drive field coils due to both skin-effect losses in the coil windings and eddy-current losses in the metal package components. Because of this, various current-access approaches that would eliminate the coils have been proposed. However, these have yet to be proven.

In constructing XY coils to drive bubble memory chips, designers have strived for field uniformity over the entire chip area. One explanation for this is that drive field uniformity will insure uniform, predictable bubble propagation at every chip location when the permalloy propagation elements have a preselected configuration and positioning. A perfectly uniform drive field cannot be obtained due to practical construction limitations. However, it can be approached by precisely winding the XY coils and by centrally positioning the upper surface of the bubble chip precisely in the middle of the coils.

In the uniform field approach the X and Y coils generally extend over the entire surface area of the bubble chip and overlap its edges somewhat. Neither the X nor the Y coil has a gap therein, i.e. successive turns of each coil are immediately adjacent and each turn abuts against a preceding turn.

Conventional bubble memories which include uniformly wound XY drive field coils typically dissipate approximately 0.75 to approximately 1.0 watts in such coils during operation. This power is dissipated in the form of heat which raises the temperature of the environment in which the bubble memory must operate. If the temperature of the bubble memory rises too high, spurious bubbles will be generated and the memory will not operate properly. Assume, for example, that the proper maintenance and propagation of bubbles can occur so long as the temperature of the garnet film is between approximately 0°–100° C. The packaging which surrounds the bubble chip, the coil, and the permanent magnet tends to retain the heat generated by power dissipation. This causes the temperature of the bubble chip to increase. If the temperature of the ambient air is approximately 40° C., then the maximum temperature rise within the package that can be tolerated would be 70° C. It would therefore be desirable to reduce the amount of power dissipated in the drive field coils in order to lessen the amount of heat generated thereby and thus permit the bubble memory to operate in higher ambient temperature environments.

Another important design rule to consider is that if the power requirement of the drive field coils can be reduced, cost savings in the drive field circuitry can be achieved. Integrated drive circuitry is preferable over drive circuitry incorporating discrete components. This is because the former is cheaper to manufacture on a large scale and requires less space.

Presently in most bubble memory chip architectures that have been considered for manufacture, data is stored in a plurality of data storage loops located in the central or medial area of the chip. The active components of the chip, including the transfer gates, replicate gates, and bubble detectors, are located in peripheral edge areas of the chip. Typically, the active components require a drive field magnitude in order to operate which is considerably greater than that required for the storage loops. For example, the active components in a bubble memory typically require a drive field strength of approximately 45–50 Oersteds while the storage loops only require approximately 35 Oersteds. It is conventional to provide a uniform drive field, i.e. one having the same magnitude at all locations on the chip, which is strong enough to drive the active components. Thus the bubbles in the storage loops are "over driven" and power wastage results.

SUMMARY OF THE INVENTION

It is therefore a primary object of the present invention to provide an improved magnetic bubble memory.

Another object of the invention is to provide a magnetic bubble memory in which the amount of power which must be supplied to the XY drive field coils is reduced.

Another object of the present invention is to minimize over-heating in a bubble memory due to power dissipation in the drive field coils.

Still another object of the present invention is to enable the use of less expensive drive field circuitry in a magnetic bubble memory.

A still further object of the present invention is to optimize the dissipation of power in the drive field coils of a magnetic bubble memory by providing a high drive field for its active components and a low drive field for its storage area.

The magnetic bubble memory of the present invention includes a bubble memory chip for propagating magnetic bubbles under the influence of a Z bias magnetic field and a rotating XY magnetic drive field. The chip has active components in first predetermined areas requiring a first predetermined magnitude of the drive field in order to operate. The chip further has a plurality of propagation paths in a second predetermined area which require a second predetermined magnitude of the drive field in order for the magnetic bubbles to propagate along the paths. The second predetermined magnitude of the drive field is substantially less than the first predetermined magnitude. Conventional permanent magnets positioned adjacent the bubble memory chip provide the Z bias magnetic field. A pair of coils encircle the chip for providing the rotating XY magnetic drive field when predetermined signals are applied thereto. At least one of these coils is non-uniformly wound to provide the first predetermined magnitude of the drive field in the first predetermined areas of the chip and the second predetermined magnitude of the drive field in the second predetermined area of the chip.

According to the disclosed embodiment, a bubble memory chip is mounted on the center leg of a E-shaped planar frame so that the X and Y axes of the chip are in alignment with those of the center leg. The chip has a block-replicate architecture in which the gates and the bubble detectors are located in a pair of peripheral edge areas of the chip spaced apart on the Y axis thereof. A plurality of data storage loops are located in the medial area of the chip between the peripheral edge areas. A pair of concentric, mutually orthogonal XY coils encircle the center leg of the frame and the chip. The Y coil has a uniformly wound inner layer and an outer layer having a gap therein which conforms in size to, and is in registration with the medial portion of the chip. When predetermined signals are applied to the X and Y coil to provide the rotating XY drive field, a higher drive field will be provided in the peripheral edge areas of the chip than in the medial area of the chip. Thus the gates and the bubble detectors will receive a larger magnitude of the drive field than the data storage loops, the latter requiring a substantially less magnitude of the drive field in order to operate. The net result is that overall coil power consumption can be reduced by approximately 10 to 15% over conventional ranges without impairing bubble transfer, replicate, detection, and other functions on the chip.

BRIEF DESCRIPTION OF THE DRAWINGS

FIG. 3 is an enlarged fragmentary view of the memory in FIG. 1 illustrating the winding of the X and Y drive field coils in relationship to the bubble memory chip.

FIG. 4 is a vertical sectional view taken along line 4—4 of FIG. 3.

FIG. 5 is a vertical sectional view taken along line 5—5 of FIG. 3.

FIGS. 6 and 7 are graphs depicting magnetic field strength as a function of location on the chip for each of the X and Y coils respectively.

Like reference numerals throughout the figures refer to like parts. Unless otherwise indicated, the relative dimensions in the figures are not to scale.

DESCRIPTION OF THE PREFERRED EMBODIMENT

Figure 1:
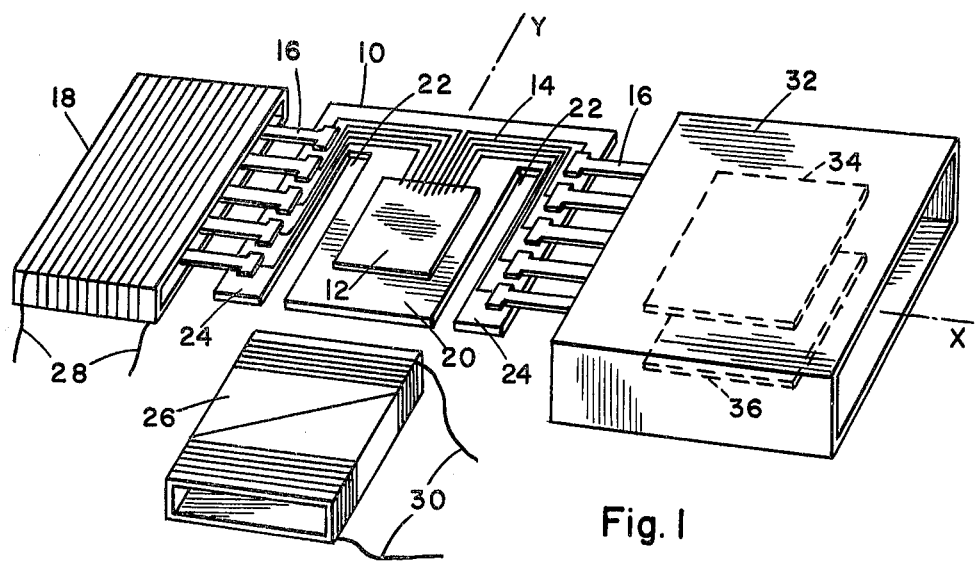
FIG. 1 is a perspective view of a field-access magnetic bubble memory constructed according to a preferred embodiment of the present invention.

Referring to FIG. 1, the preferred embodiment of the magnetic bubble memory of the present invention includes a E-shaped planar chip-carrier frame 10. A bubble memory chip 12 is mounted on the center leg of the plane so that the X and Y axes of the frame and chip are in alignment as shown. As is conventional, the frame 10 has the shape of an E to facilitate coil assembly as hereafter described. The frame is made either from filled epoxy board or from Polyimide tape which is beam-lead-bonded to the chip with a coil-support structure molded around it (not shown). An array of conductive leads 14 on the frame are connected at their one ends to input and output contacts 62 (not shown in FIG. 1) along one edge of the chip and that their other ends to a plurality of lead frame pins 16.

An X coil 18 (FIG. 1) is first slipped over the frame 10 by moving it along the X axis until it is in alignment with the center leg 20 of the frame. The X coil is sized so that it substantially covers the center leg of the frame and the chip while leaving a pair of slots 22 between the center leg 20 and the outer legs 24 of the E-shaped frame unobstructed. Thereafter, a Y coil 26 is slipped over the X coil 18, the center leg 20 and the bubble chip 12 by moving it along the Y axis so that its side portions fit within the slots 22. The X and Y coils thus assembled are concentric and mutually orthogonal since each is made of turns of wire which extend perpendicular to the turns of wire of the other. When suitable electrical signals are applied to the leads 28 and 30 of the X and Y coils, an in-plane rotating magnetic drive field $H_r$ (FIG. 2) is produced.

The assembled frame, bubble chip, and drive coils are inserted into an open-ended Mumetal shield 32 (FIG. 1). The shield provides the return path for the magnetic flux produced by the permanent magnets 34 and 36 and at the same time, shields the chip 12 from stray external fields. Upper and lower permanent magnets 34 and 36 are positioned within the shield above and below the bubble memory chip 12 and provide a Z bias magnetic field $H_b$ (FIG. 2).

The bubble memory chip 12 includes a layer of garnet and an overlying pattern of permalloy elements which define a plurality of propagation paths. The maintenance and propagation of magnetic bubble domains in the garnet is accomplished under the influence of the Z bias magnetic field $H_b$ and the rotating magnetic drive field $H_r$ (FIG. 2). As explained more fully hereafter, the chip 12 has active components in first predetermined areas which require a first predetermined magnitude of the drive field in order to operate properly and these include transfer gates, replicate gates, bubble detectors, etc. The chip further has a plurality of propagation paths in a second predetermined area which require a second predetermined magnitude of the drive field in order for magnetic bubbles to propagate along the same. These propagation paths consist of a plurality of data storage loops. The second predetermined magnitude of the drive field which is required for propagation of magnetic bubbles around the data storage loops is substantially less than the first predetermined magnitude of the drive field which is required to operate the active components of the bubble memory chip. By way of example, the active components may require a drive field magnitude of approximately 45-50 Oersteds while the data storage loops may require a drive field measuring only 35 Oersteds. As hereafter described, one of the coils which encircles the chip is non-uniformly wound in order to provide the first predetermined magnitude of the drive field in those areas of the chip containing the active component and the second predetermined magnitude of the drive field in those areas of the chip containing the storage loops.

For purposes of illustration only, the present invention will be described in connection with a bubble memory chip having a dual block-replicate architecture. However, it is to be emphasized that the present invention is equally applicable to bubble memory chips having a wide variety of other architectures so long as they have active components in one or more first predetermined areas requiring a relatively high drive field and storage devices in one or more second predetermined areas requiring a relatively low drive field.

Figure 2:
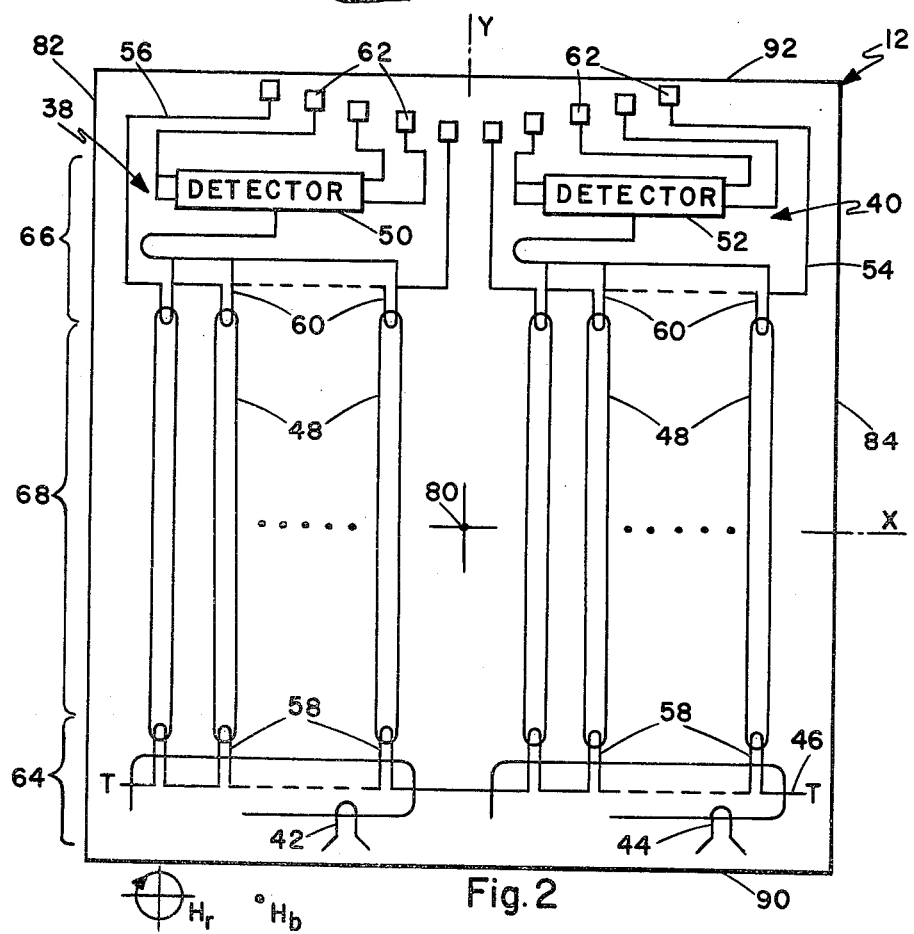
FIG. 2 is a schematic diagram of the architecture of the bubble memory chip incorporated in the memory of FIG. 1.

Referring to FIG. 2, there is shown therein a schematic diagram of the dual block replicate architecture of the bubble memory chip 12. Two conventional block replicate organizations are positioned on the same chip in side by side fashion. They are designated generally with reference numerals 38 and 40. In combination, they include bubble generators 42 and 44, a common transfer-in control conductor 46, a plurality of side by side data storage loops 48, a pair of bubble detectors 50 and 52, and a pair of transfer-out control conductors 54 and 56. The dual block replicate architecture further includes a plurality of transfer gates 58, one for each of the data storage loops 48, which permit the inputting of bubbles into the storage loop upon pulsing the transfer-in control conductor 46. The architecture also includes a plurality of replicate gates 60, one for each of the data storage loops 48, which permit the outputting of bubbles from the data storage loops upon pulsing of the respective transfer-out control conductors 54 and 56. The various control conductor lines are connected to a plurality of contacts 62 along one edge of the chip.

The contacts 62 (FIG. 2) are beam-lead-bonded to corresponding ones of the frame leads 14 as shown in FIG. 1. The frame leads 14 provide a means for transmitting electrical signals to the chip 12, and for receiving electrical signals therefrom. Preferably, all of the leads 14 lie on one surface of the E-shaped frame 10. Thus, only one metallization layer is required on that substrate, which in turn minimizes cost. Under some circumstances, however, it may be necessary to include metallization layers on the under side of the E-shaped frame.

Preferably, the bubble memory chip 12 is mechanically aligned with respect to the X and Y coils 18 and 26, such that the active surface of the chip receives no Z directional component from the rotating XY magnetic drive field. The rotating drive field produces a Z component in off-center planes. This Z component would adversely affect the propagation of bubbles on the chip by reducing the net Z bias operating range.

Referring back to FIG. 2, it can be seen that the active components of the bubble memory chip 12, that is the transfer gates, replicate gates, and bubble detectors, are located in a pair of peripheral edge areas 64 and 66 at opposite ends of the chip. The data storage loops 48 are located in the medial area 68 of the chip between the peripheral edge areas 64 and 66. The peripheral edge areas 64 and 66 are referred to herein as high drive field areas and the medial area 68 is referred to as a low drive field area. This is because the active components of the chip require a predetermined magnitude of the drive field to operate which is substantially greater than the magnitude of the drive field required to propagate bubbles along the storage loops. For example, the active components may require a drive field magnitude of approximately 45-50 Oersteds while the data storage loops may require a drive field magnitude of only 35 Oersteds.

By way of example, the peripheral area 64 including the transfer gates 58 may measure approximately 30 mils in length (measured along the Y axis), the peripheral edge area 66 including the replicate gates 60 and the bubble detectors 50 and 52 may measure approximately 80 mils in length, and the medial area 68 containing the data storage loops 48 may measure approximately 190 mils in length for a 256K chip or alternatively 290 mils in length for a 1 megabit chip.

The construction details of the X and Y coils 18 and 26 will now be described by way of reference to FIGS. 3-5. The X coil includes inner and outer layers 70 and 72 (FIG. 4) and the Y coil 26 includes inner and outer layers 74 and 76 (FIG. 5). Each of the layers is made of adjacent turns of a suitable wire such as #30 magnetic wire. The inner and outer layers of each coil are formed from one continuous piece of wire which is preferably automatically wound on a suitably sized mandrel mounted on a winding machine. Both of the coils extend substantially beyond the outer perimeters of the chip 12 which is shown in phantom lines in FIG. 3. This minimizes drive field non-homogenity effects which occur at the boundaries of the coil. This non-homogeneity would also adversely effect the chip operation if the upper surface of the chip were not located in the center of the coil. The geometry of the E-shaped frame 10 facilitates the assembly of the memory with the chip in proper alignment with respect to the coils.

It will be noted in FIGS. 3-5 that the X and Y coils 18 and 26 are concentric and mutually orthoganal. In other words, the X coil 18 is positioned centrally within the Y coil as previously described. Furthermore, the turns of wire of the respective coils extend perpendicularly to each other. Both the inner and outer layers 70 and 72 of the X coil are uniformly wound as best seen in FIG. 4. In other words, each turn of wire is in substantial abutting relationship with the turns of wire preceding and following it and there are no gaps of any significant size between adjacent turns of wire.

The profile of the X component of the drive field produced by the X coil 18 is illustrated in the graph of FIG. 6. The strength $H_x$ of the X component of the magnetic drive field provided by the X coil 18 is along the vertical axis of the graph. The distance along the X axis of the chip is indicated along the horizontal axis of the graph in FIG. 6. Curve 78 thus represents the strength of the $H_x$ field at various points across the width of the bubble memory chip 12 (FIG. 2). The XY centerpoint 80 and the side edges 82 and 84 of the chip are indicated by phantom lines in the graph of FIG. 6. By inspecting the curve 78 it can be seen that the magnitude of the X component of the drive field is constant across the major portion of the width of the chip and falls off slightly adjacent the side edges 82 and 84 thereof. The uniformity of the X coil field profile is attributable to the fact that its inner and outer layers 70 and 72 (FIG. 4) are uniformly wound and extend outwardly a substantial distance beyond the outer edges of the chip (FIG. 3).

Referring again to FIG. 5, it can be seen that the inner layer 74 of the Y coil 26 is uniformly wound. However, the outer layer 76 of the Y coil is non-uniformly wound as best seen in FIGS. 3 and 5 to provide first and second segments 76a and 76b which are separated by a gap 86. A single strand 88 (FIG. 3) of the wire which comprises the Y coil traverses the gap 86 in diagonal fashion to connect the segments 76a and 76b. The outer layer 76 of the Y coil is non-uniformly wound in this fashion in order to provide a relatively high drive field in the peripheral edge areas 64 and 66 (FIG. 2) of the chip and a relatively low drive field in the medial area 68 of the chip. Preferably, the outer layer 76 of the coil is wound and positioned relative to the chip so that the gap 86 corresponds in length to, and is in registration with, the medial storage area 68 of the chip. Thus, the segments 76a and 76b will be in longitudinal registration with the peripheral edge areas 64 and 66. In other words, if the medial storage area 68 of the chip measures 190 mils in length, the gap 86 would also preferably measure 190 mils in length. That is to say, the distance along the Y axis between the segments 76a and 76b of the outer layer of the Y coil would be approximately 190 mils. If the medial storage area 68 measures 290 mils length, the gap 86 would also measure 290 mils in length.

It will be noted by inspecting FIGS. 3 and 5, that the inner layer 74 of the Y coil overlies both the peripheral edge areas 64 and 66 and the medial storage area 68 of the chip. It is necessary to have at least one layer in the Y coil which is uniformly wound in this fashion since all areas of the chip must have some Y component of the drive field. However, the segments of the outer layer of the Y coil only overlie the peripheral edge areas of the chip. The net result is an increased magnitude of the drive field in those portions of the chip in which the active components are located. The drive field in the peripheral areas of the chip could be further strengthened by winding the Y coil with additional outer layers having similarly dimensioned and spaced apart segments.

FIG. 7 is a graph similar to FIG. 6 which illustrates the strength of the Y component of the drive field as a function of distance along the Y axis of the chip. The phantom lines 90 and 92 in FIG. 7 indicate the location of the bottom and top edges of the chip 12 (See FIG. 2). Also the phantom line 80 in FIG. 7 indicates the location of the XY centerpoint of the chip. The curve 94 in FIG. 7 thus represents the profile of the field strength $H_y$ of the non-uniformly wound Y coil as a function of distance along the Y axis of the chip. It can be seen that $H_y$ peaks in the peripheral edge areas 64 and 66 and is relatively lower in the medial storage area 68.

By winding the X and Y coils, as previously described, dissipation of power in the coils is optimized. In other words, the magnitude of the drive field is highest in the areas where it is needed to drive the active components and it is lowest in the medial storage area where the low drive storage loops are located. This arrangement permits the driving of the coils with the minimum amount of power required to operate the active components of the chip without wasting power by overdriving bubbles in the storage loops. With this arrangement, it is possible to reduce overall coil power requirements by approximately 10 to 15%. For example, if uniformly wound X and Y coils in the bubble memory require between 0.75 and 1.0 watts, by non-uniformly winding the Y coil as previously described, the coils can be driven at a power level which is approximately 100 to 150 milowatts less. This arrangement results in cost savings in the drive field circuitry and further extends the operating temperature range of the memory by reducing heat dissipation.

Having described a preferred embodiment of the present invention, it will be apparent to those skilled in the art that the invention permits of modification in both arrangement and detail. For example, the active component of the chip could be positioned along the peripheral edge areas of the chip at the sides thereof. In this case, the X coil would be non-uniformly wound in an analogous manner to the winding of the Y coil described above, and the Y coil would be uniformly wound. Furthermore, a wide variety of other arrangements of high drive field and low drive field chip areas could be accommodated with different coil windings pursuant to the invention. We claim as our invention all such modifications which come within the true spirit and scope of the following claims.

We claim:

1. A magnetic bubble memory comprising:
    a bubble memory chip for propagating magnetic bubbles under the influence of a Z bias magnetic field and a rotating XY magnetic drive field;
    the chip having active components in first predetermined areas requiring a first predetermined magnitude of the drive field to operate;
    the chip further having a plurality of propagation paths in a second predetermined area requiring a second predetermined magnitude of the drive field in order for magnetic bubbles to propagate along the paths, the second predetermined magnitude being substantially less than the first predetermined magnitude;
    means positioned adjacent the chip for providing the Z bias magnetic field; and
    a pair of coils encircling the chip for providing the rotating XY magnetic drive field when predetermined signals are applied thereto, at least one of the coils being non-uniformly wound to provide the first predetermined magnitude of the drive field in the first predetermined areas of the chip and the second predetermined magnitude of the drive field in the second predetermined area of the chip.

2. A magnetic bubble memory according to claim 1 wherein the coils are concentric and mutually orthogonal.

3. A magnetic bubble memory according to claim 1 wherein:
    the first predetermined areas of the chip are a pair of peripheral edge areas located at opposite ends of the chip;
    the second predetermined area is located between the peripheral edge areas; and
    the coils are concentric and mutually orthogonal, each of the coils includes inner and outer layers made of adjacent turns of wire, and the non-uniformly wound coil has one uniformly wound layer and at least one non-uniformly wound layer made of first and second segments separated by a gap, each of the segments having portions overlying one of the peripheral edge areas of the chip, and the gap being in registration with the second predetermined area of the chip.

4. A magnetic bubble memory according to claim 1 wherein:
    the chip includes a plurality of gates and a magnetic bubble detector in the first predetermined areas; and the chip includes a plurality of data storage loops in the second predetermined area.

5. A magnetic bubble memory according to claim 4 wherein the chip has a block-replicate architecture.

6. A magnetic bubble memory according to claim 3 wherein:
the chip includes a plurality of transfer gates located in one of the peripheral edge areas, a plurality of replicate gates and at least one magnetic bubble detector located in the other one of the peripheral edge areas, and a plurality of data storage loops in the second predetermined area;
the coil for the X component of the drive field is positioned within the coil for the Y component of the drive field; and
the coil for the Y component of the drive field is the non-uniformly wound coil.

7. A magnetic bubble memory according to claim 6 wherein:
the one non-uniformly wound layer of the coil for the Y component of the drive field is positioned outside the uniformly wound layer of the same coil.

8. A magnetic bubble memory according to claim 6 wherein:
the peripheral edge area including the transfer gates measures approximately 30 mils in length;
the peripheral edge area including the replicate gates and the bubble detector measures approximately 80 mils in length;
the second predetermined area including the data storage loops measures approximately 190 mils in length; and
the gap in the non-uniformly wound layer of the coil for the Y component of the drive field measures approximately 190 mils in length.

9. A magnetic bubble memory according to claim 6 wherein:
the peripheral edge area including the transfer gates measures approximately 30 mils in length;
the peripheral edge area including the replicate gates and the bubble detector measures approximately 80 mils in length;
the second predetermined area including the data storage loops measures approximately 290 mils in length; and
the gap in the non-uniformly wound layer of the coil for the Y component of the drive field measures approximately 290 mils in length.

10. A magnetic bubble memory according to claim 3 wherein both coils extend outwardly beyond the outer edges of the chip.

11. A magnetic bubble memory comprising:
an E-shaped planar frame having a pair of outer legs and a center leg, the frame having X and Y axes;
a bubble memory chip mounted on the center leg of the frame for propagating magnetic bubbles under the influence of a Z bias magnetic field and a rotating XY magnetic drive field;
the chip having X and Y axes positioned in alignment with the X and Y axes of the frame;
the chip further having active components located in a pair of peripheral edge areas spaced apart on the Y axis of the chip requiring a first predetermined magnitude of the drive field to operate, and a plurality of propagation paths located in the medial area of the chip between the peripheral edge areas which require a second predetermined magnitude of the drive field to propagate bubbles along the paths, the second predetermined magnitude being substantially less than the first predetermined magnitude;
means positioned adjacent the chip for providing the Z bias magnetic field; and
a pair of concentric, mutually orthogonal coils encircling the center leg of the frame and the chip, the coil for providing the Y component of the drive field having a uniformly wound inner layer and at least one outer layer having a gap therein which conforms in size to, and is in registration with, the medial portion of the chip;
whereby when predetermined signals are applied to the coils to provide the rotating XY field, the first predetermined magnitude of the drive field will be provided in the peripheral edge areas of the chip and the second predetermined magnitude of the drive field will be provided in the medial area of the chip.

* * * * *